United States Patent

Bryden

[15] 3,646,549

[45] Feb. 29, 1972

[54] GENERATOR WITH DIFFERENTIAL DIGITAL-TO-ANALOG CONVERTER

[72] Inventor: Joseph E. Bryden, Framingham, Mass.

[73] Assignee: Raytheon Company, Lexington, Mass.

[22] Filed: Nov. 25, 1968

[21] Appl. No.: 778,583

[52] U.S. Cl. .......... 340/347 DA, 235/151

[51] Int. Cl. .......... H03k 13/02

[58] Field of Search .......... 340/347, 324.1; 235/151

[56] References Cited

UNITED STATES PATENTS

| | | | |
|---|---|---|---|
| 3,320,409 | 5/1967 | Larrowe | 340/347 |
| 3,345,505 | 10/1967 | Schmid | 340/347 |
| 3,381,290 | 4/1968 | Breitenbach | 340/347 |
| 3,504,360 | 3/1970 | Vosburg | 340/347 |
| 3,504,362 | 3/1970 | Feldmann | 340/347 |

FOREIGN PATENTS OR APPLICATIONS

| | | | |
|---|---|---|---|
| 929,832 | 3/1961 | Great Britain | 235/151 |

*Primary Examiner*—Maynard R. Wilbur
*Assistant Examiner*—Jeremiah Glassman
*Attorney*—Harold A. Murphy and Joseph D. Pannone

[57] ABSTRACT

A vector generator employing a single differential digital-to-analog converter for changing from the analog of a first digital number to that of a second following any predetermined linear slope. The converter utilizes a single ladder network eliminating the differential errors which would be present in typical systems using two separate digital-to-analog ladder networks.

7 Claims, 3 Drawing Figures

INVENTOR
JOSEPH E. BRYDEN

BY Irving S. Rappaport
ATTORNEY

INVENTOR
JOSEPH E. BRYDEN

BY Irving S. Rappaport
ATTORNEY

INVENTOR
JOSEPH E. BRYDEN
BY Irving S. Rappaport
ATTORNEY

GENERATOR WITH DIFFERENTIAL DIGITAL-TO-ANALOG CONVERTER

BACKGROUND OF THE INVENTION

One prior art approach for generating $X$ and $Y$ deflection signals for drawing vectors on a cathode ray tube display includes the use of a pair of digital-to-analog converters for each deflection signal. In such a system means are provided for fading out one digital-to-analog converter carrying the start position of the vector and fading in a second digital-to-analog converter carrying the end position of the vector. For a constant writing speed, the time required to draw a vector will be:

$$\tau = T' \left(\Delta X^2 + \Delta Y^2\right)^{1/2} \quad 1.$$

where $T'$ is the time required to draw a vector of unit length. The $X$ and $Y$ digital-to-analog converters must fade over in precisely the same time and therefore the reference voltages applied to the digital-to-analog converters must change from 0 (or $V_r$) to $V_r$ (or 0) in time $\tau$. The digital-to-analog converters in each axis are alternately loaded with the new position data and during the intervals $\tau_n$, $\tau_{n+1}$, etc., a ramp generator alternately provides the following outputs:

$$V_n = V_r \cdot (t/\tau_n) \quad 2.$$

$$V_{n+1} = V_r (1 - t/\tau_{n+1}) \quad 3.$$

In the above-described prior art type of system, in order to obtain correct instantaneous direction of the vector being drawn, the output of the digital-to-analog converters must be accurate proportions of the input voltages at all times. These proportions are determined by the inputs to the converters. The period $\tau$ of the ramps ($V_r \rightarrow 0$ & $0 \rightarrow V_r$) applied to the digital-to-analog converters has a very wide range. The smallest period $\tau$ is the time taken to draw the smallest resolvable line while the longest period is that for a full screen diagonal. Therefore, an accurate output from the sum of a pair of digital-to-analog converters is very dependent upon their relative responses and requires very precise control in fabrication. Because of these accuracy requirements resulting from the use of a time function, differential errors are encountered.

In order to overcome these differential errors, the present invention replaces the pair of digital-to-analog converters with a single ladder network (or current summing network) in which only those bits which are different between two digital numbers $X_1$ and $X_2$ (or $Y_1$ and $Y_2$) are changed. Each different bit is changed from 0 to $V_r$ or $V_r$ to 0, in the time $\tau$. Those bits which have the same value in the two numbers are held at $V_r$ or 0. Another advantage of the present invention is that since only one ladder network is being used, driving power requirements are substantially reduced.

SUMMARY OF THE INVENTION

The above advantages and objects of the present invention, as well as others, are achieved by providing a vector generator in which $X$- and $Y$-axis deflection signals are produced in order to generate vectors at any desired writing rate, the generator comprising $X$- and $Y$- axis circuits each including a plurality of input lines over which a plurality of incoming signals are applied, means for storing each of the incoming signals, means for generating time function ramp signals, a separate digital-to-analog conversion means to which are applied the output from each of the corresponding storage means and the ramp signals, a single ladder network corresponding to each of the axes to which the output from each of said conversion means is applied, and means corresponding to each of the axes for summing the outputs of the corresponding ladder network to produce a deflection signals.

DESCRIPTION OF THE PREFERRED EMBODIMENTS

Figure 1:
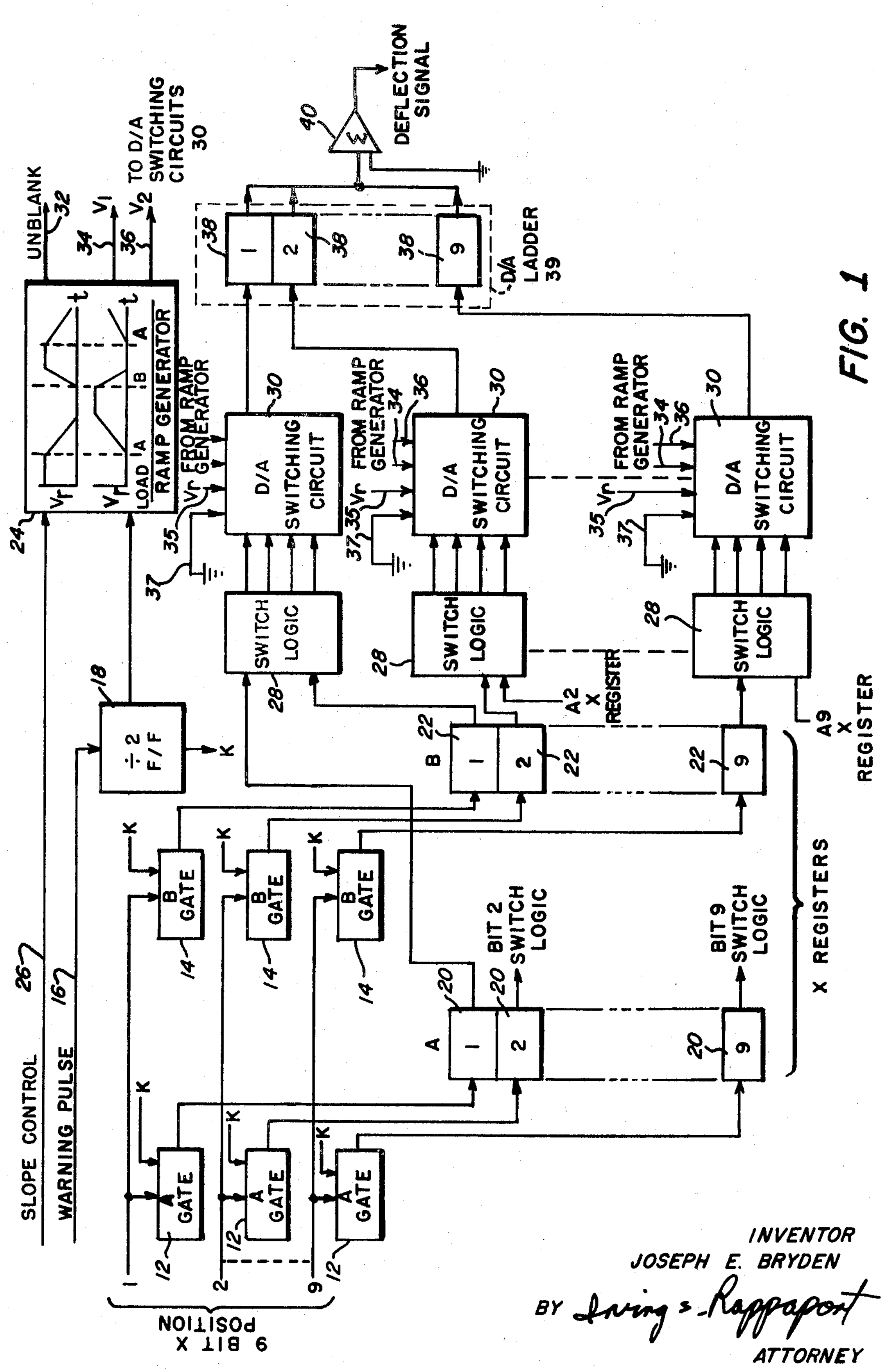
FIG. 1 is a block diagram showing the $X$-axis portion of the system employing the present invention.

FIG. 1 shows a circuit 10 for generating the $X$-axis deflection signals for drawing vectors on a cathode ray tube display. Circuit 10 shows a nine bit $X$-position input arrangement. Each of the $X$-bit inputs are numbered 1 to 9 respectively. Each of the $X$-position input bits are applied to a respective A-gate 12 and a B-gate 14. An input warning pulse is applied on a line 16 to a divide-by-two flip-flop 18. The warning pulse applied on line 16 to the flip-flop 18 warns the flip-flop 18 of new data on the way before the new position information is actually formed on the nine bit $X$-position input lines. An output from flip-flop 18 labeled K is applied to each of the A- and B-gates 12 and 14 to alternately open these gates to A and B $X$-position registers 20 and 22 respectively. There is both an A and B $X$-position register 20 and 22 respectively corresponding to each of the A- and B-gates 12 and 14 respectively.

The output from the flip-flop 18 is also applied to a ramp generator 24 via a line 23. A slope control signal is applied to the ramp generator 24 via a line 26 and the signal applied from the flip-flop 18 via line 23 to the generator 24 controls the direction of slope of the ramp generated. The output from each of the A and B $X$-position registers 20 and 22 respectively are applied to a switching logic circuit 28 respectively. The output from each of the switching logic circuits 28 are applied to a corresponding digital-to-analog switching circuit 30 respectively.

The ramp generator 24 produces an unblanking signal on line 32 and also produces two outputs $V_1$ and $V_2$ on lines 34 and 36 respectively during the time interval $\tau$. The outputs from the generator 24, the corresponding new data into the A- or B-register 20 or 22 respectively and the ramp slope thereof are shown in the following table:

TABLE I

| Ramp Generator Outputs | New Data Into Register | Ramp Slope |
|---|---|---|
| $V_1$ | A | $V_r \cdot t/\tau$ |
| | B | $V_r \cdot (1-t/\tau)$ |
| $V_2$ | A | $V_r \cdot (1-t/\tau)$ |
| | B | $V_r \cdot t/\tau$ |

For the remainder of the time $V_1$ and $V_2$ hold the voltage $V_r$ or 0 which was reached at the end of the ramp interval. It should be noted that the alternate ramp slopes are locked to the alternate loading of the A and B $X$-position registers 20 and 22 respectively. Thus, the logic decision which is correct for selecting $V_1$ or $V_2$ when loading new data into the B $X$-position register 22 is also correct for any data loaded into the A $X$-position register 20.

The ramp generator 24 supplies all the X and Y switching circuits 30 on a common line. As shown in FIG. 1, the outputs on lines 34 and 36 are supplied to each of the $X$-axis digital-to-analog switching circuits 30. Also supplied to each of the $X$-axis digital-to-analog switching circuits 30 are the reference voltages $V_r$ and 0 on lines 35 and 37 respectively. Transients due to the switching circuits 30 are negligible because the change over is always made between two switching circuits having identical input levels (0 or $V_r$). Transients and time delays can be of importance in writing vectors of a precise length. The slope control may be set up immediately after an arithmetic unit (not shown) has calculated the value of $\tau$. However, the ramps need not be started until a further small interval has elapsed to allow unwanted transients to become insignificant. Other timing problems are eased by having comparators (not shown) which detect the 0 and $V_r$ levels in the ramp generator 24. The CRT beam would only be unblanked when the ramp is between these levels and the circuit is instructed to write vectors. These comparators may also be used to generate "vector completed" signals to demand the next position data.

The output from each of the $X$-axis digital-to-analog switching circuits 30 is fed to a corresponding element 38 of a digital-to-analog ladder network 39. The outputs from the ladder network 39 are all summed in an amplifier 40 whose output represents the $X$-axis deflection signal.

Figure 2:
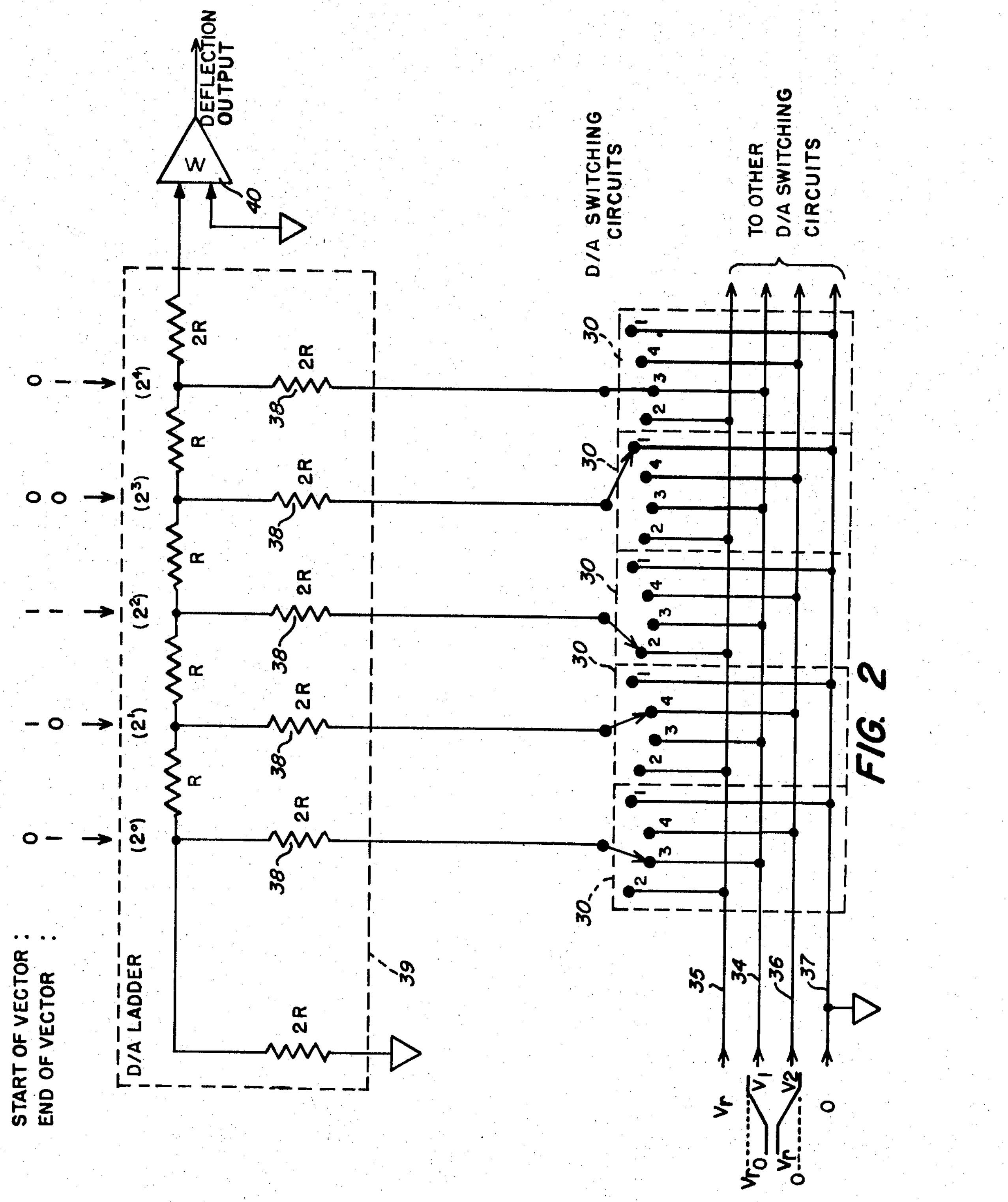
FIG. 2 is a simple circuit diagram illustrating the principle of operation of the differential digital-to-analog converter employed in FIG. 1.

FIG. 2 shows a circuit embodying the digital-to-analog ladder network 39 shown in FIG. 1 and also the $X$-axis digital-to-analog switching circuits 30 shown in FIG. 1. FIG. 2 indicates that a single ladder network 39 is employed in which only those bits which are different between the digital numbers $X_1$ and $X_2$ (or $Y_1$ and $Y_2$) are changed. Each different bit is changed from 0 to $V_r$, or $V_r$ to 0, in the time $\tau$. Those bits which have the same value in the two numbers are held at $V_r$, or 0. As an example, consider two numbers defining the start and end of a vector for the $X$-axis:

| | Binary | Decimal |
|---|---|---|
| START ($X_1$): $(0)2^4+(0)2^3+(1)2^2+(1)2^1+(0)2^0=$ | 00110 | $=6$ |
| END ($X_2$): $(1)2^4+(0)2^3+(1)2^2+(0)2^1+(1)2^0=$ | 10101 | $=21$ |

Using the two ramp waveforms, $V_r \cdot t/\tau$ between $0 \leq t \leq \tau$ $V_r \cdot (1-t/\tau)$ between $0 \leq t \leq \tau$ the output of the ladder network 39 and amplifier 40 will be, $a \cdot V_r \cdot [(t/\tau)\, 2^4+2^2+(1-t/\tau)\, 2^1+(t/\tau)2^0)=2 \cdot V_r \cdot ]t/\tau \cdot 15+6]$ which is a linear change, completed in time $\tau$, from the start voltage $a \cdot V_r\,(X_1)$ to the end voltage $a \cdot V_r\,(X_2)$.

The digital-to-analog switching circuits 30 shown diagrammatically in FIG. 2 each must take one of four positions determined by each pair of bits of the digital numbers. The four inputs 0, $V_r$, $V_1$ (0 to $V_r$), and $V_2$ ($V_r$ to 0) as shown in FIG. 1 are applied respectively to each switching circuit 30 via lines 37, 35, 34 and 36 respectively. The position of each of the switching circuits 30 determines the signal applied by the ladder network 39 to the summing amplifier 40 whose output is the $X$-axis deflection signal.

Figure 3:
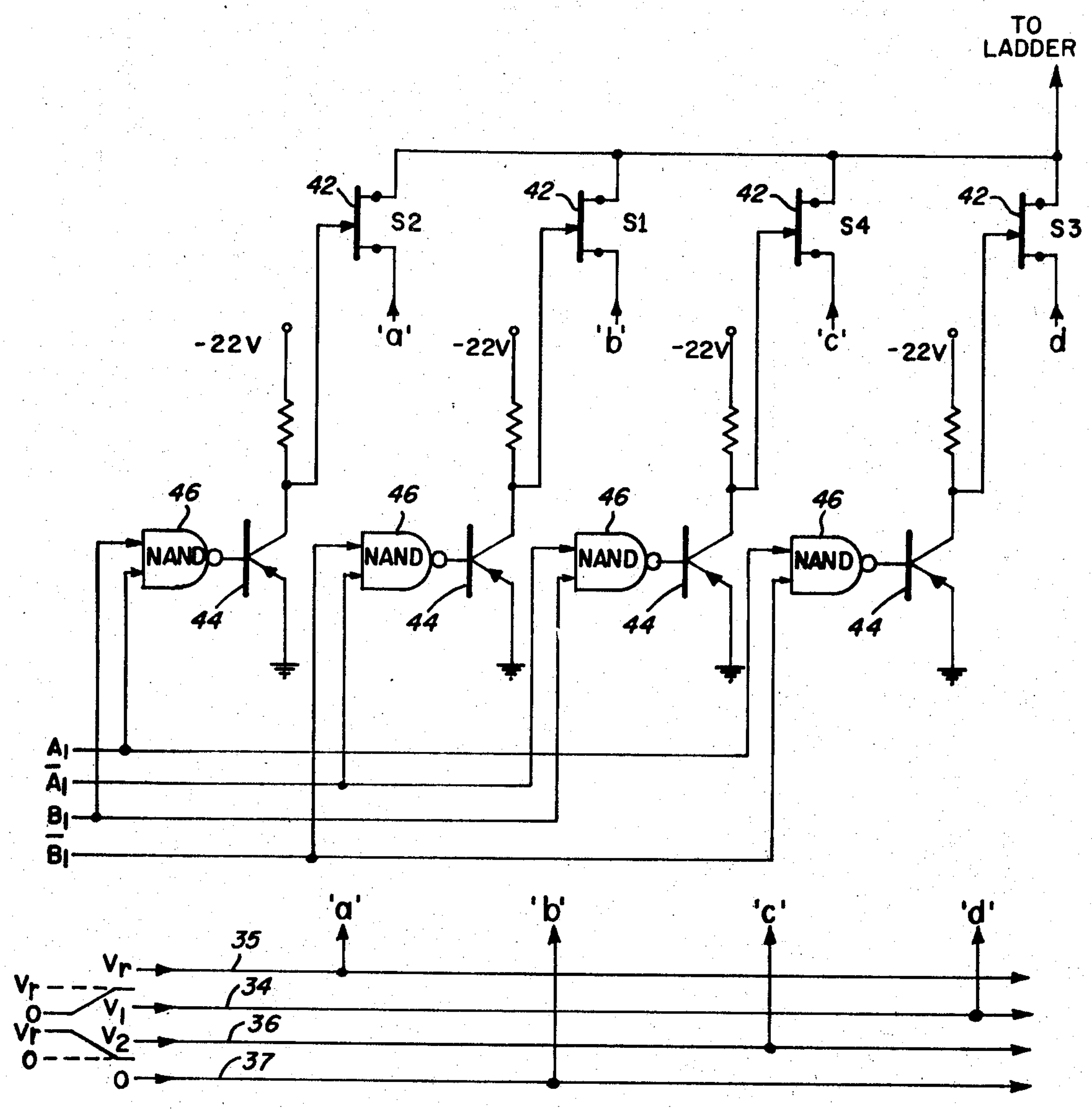
FIG. 3 is a schematic circuit of the switches employed in controlling one bit of the differential digital-to-analog converter shown in FIG. 2.

FIG. 3 indicates, schematically, one of the possible forms for each switching circuit 30 shown in FIG. 2. The four-position switching circuit 30 shown in FIG. 2 is replaced by four-field effect transistor (FET) switches 42 and drivers 44. Typical FET switches circuits are well known and are described in many recent treatises on semiconductor switches. The decision for closing one of the switches 42 is made by comparing the new digital number with the old number. For this purpose, two of the A and B $X$-position registers 20 and 22 are required. For convenience of the discussion, assume that the new number is placed in one B $X$-position register 22, and the old number is in the corresponding A $X$-position register 20. Table 1 indicates the switch positions for FIG. 2 or the conductive FET switches 42 in FIG. 3.

TABLE II

Switch Selection For Each Combination Of Old And New Bits

| | | Input to Branch of D/A | | | |
|---|---|---|---|---|---|
| Old Bit | New Bit | 0 | $V_r$ | $V_r t/\tau$ | $V_r(1-t/\tau)$ |
| 0 | 0 | S1 | | | |
| 1 | 1 | | S2 | | |
| 1 | 0 | | | | S4 |
| 0 | 1 | | | S3 | |

A simple truth table may be established for the logic by using the following identities:

TABLE III

| | |
|---|---|
| Old Bit = 0: | $\bar{A}$ |
| Old Bit = 1: | A |
| New Bit = 0: | $\bar{B}$ |
| New Bit = 1: | B |

| Switch Closed | Function |
|---|---|
| S1 | $\bar{A} \cdot \bar{B}$ |
| S2 | $A \cdot B$ |
| S3 | $\bar{A} \cdot B$ |
| S4 | $A \cdot \bar{B}$ |

Four NAND-gates 46 are required to achieve this result and are shown schematically in FIG. 3. The appropriate combination is applied through the NAND-gate 46 to the corresponding FET switches 42 via the corresponding drivers 44. The activated switch 42 applies its signal to the corresponding element 38 of the ladder network 39.

It should be understood, of course, that the foregoing disclosure relates to only a preferred embodiment of the invention and that numerous modifications or alterations may be made therein without departing from the spirit and the scope of the invention as set forth in the appended claims.

I claim:

1. A vector generator in which $X$- and $Y$- axis deflection signals are produced in order to generate vectors at any desired writing rate, said generator comprising:

$X$- and $Y$-axis circuits each including, a plurality of input lines over which a plurality of incoming signals containing logical functions are applied, a pair of parallel-connected gates associated with each of said input lines to which the incoming signals are applied, and a separate register associated with each of said gates to which the output from each of said gates is applied;

means for controlling the alternate opening and closing of said gates;

means for generating time function ramp signals;

a separate digital-to-analog conversion means to which the output from each pair of registers corresponding to each incoming signal is applied and to which the ramp signals are applied, said separate digital-to-analog conversion means including a single ladder network for deriving analog signals; and means corresponding to each of said axes for summing the output of said $X$-axis single ladder network and the output of said $Y$-axis single ladder network to produce a deflection signal.

2. A generator as set forth in claim 1 wherein:

said means for controlling the alternate opening and closing of said gates is a divide by two flip-flop whose output is fed to each of said gates and also to said means for generating said ramp signals in order to control the direction of slope of the ramp signals generated.

3. A generator as set forth in claim 1 wherein:

each of said conversion means includes a digital-to-analog switch comprising a switching transistor for each logical function and switching logic coupled to each switch to permit operation thereof.

4. A generator as set forth in claim 3 wherein:

said switching transistors are field effect transistors and the switching logic coupled to each switching transistor includes a NAND-gate for gating the incoming digital signal and a driving transistor coupled between said NAND-gate and the associated switching transistor for providing required driving power.

5. A vector generator in which $X$- and $Y$-axis deflection signals are produced in order to generate vectors at any desired writing rate, said generator comprising:

$X$- and $Y$-axis circuits each including, a plurality of input lines over which a plurality of input digital signals representing each bit of a desired vector are applied, a pair of parallel connected gates connected to each of said input lines for alternately gating each of said input digital signals, and a separate register connected to each of said gates for storing the gated output from each of said gates;

a ramp generator for generating time function ramp signals;

a divide by two flip-flop whose output is fed to each of said gates for controlling the alternate opening and closing of said gates and also fed to said ramp generator for controlling the direction of slope of the ramp signals generated;

a separate digital-to-analog conversion means coupled to the outputs of each pair of registers corresponding to each input digital signal and also coupled to the ramp signals from said ramp generator, said conversion means converting the digital signals to analog signals, said separate digital-to-analog conversion means including a single ladder network for deriving output analog signals; and means corresponding to each of said axes for summing the output of said $X$-axis single ladder network and said $Y$-axis single ladder network to produce a deflection signal.

6. A vector generator in which $X$- and $Y$-axis deflection signals are produced in order to generate vectors at any desired writing rate, said generator comprising:

$X$- and $Y$-axis circuits each including, a plurality of input lines over which a plurality of input digital signals representing each bit of a desired vector are applied, a pair of parallel connected gates connected to each of said input lines for alternately gating each of said input digital signals, and a separate register connected to each of said gates for storing the gated output from each of said gates;

a ramp generator for generating time function ramp signals;

a divide by two flip-flop whose output is fed to each of said gates for controlling the alternate opening and closing of said gates and also fed to said ramp generator for controlling the direction of slope of the ramp signals generated;

a separate digital-to-analog conversion means coupled to the outputs of each pair of registers corresponding to each input digital signal and also coupled to the ramp signals from said ramp generator, said conversion means converting the digital signals to analog signals, each of said conversion means including a digital-to-analog switch comprising a switching transistor for each logical function input thereto and switching logic coupled to each switch to permit operation thereof, said separate digital-to-analog conversion means further including a single ladder network for deriving analog output signals; and means corresponding to each of said axes for summing the output of said $X$-axis single ladder network and the output of said $Y$-axis single ladder network to produce a deflection signal.

7. A generator as set forth in claim 6 wherein:

said switching transistors are field effect transistors and the switching logic coupled to each switching transistor includes a NAND-gate for gating the incoming digital signal and a driving transistor coupled between said NAND-gate and the associated switching transistor for providing required driving power.

* * * * *